United States Patent
McGeehin et al.

(10) Patent No.: US 8,922,952 B2
(45) Date of Patent: Dec. 30, 2014

(54) SHAPED DATA SENSOR SHIELD CONTACTS

(71) Applicant: Seagate Technology LLC, Cupertino (CA)

(72) Inventors: Peter McGeehin, Letterkenny (IE); Aidan Goggin, Redcastle (IE); Kevin McNeill, Derry (GB); Marcus Ormston, Derry (GB)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/835,952

(22) Filed: Mar. 15, 2013

(65) Prior Publication Data

US 2014/0268429 A1    Sep. 18, 2014

(51) Int. Cl.
*G11B 5/39* (2006.01)
(52) U.S. Cl.
CPC .................................. *G11B 5/3912* (2013.01)
USPC ......................................................... 360/319
(58) Field of Classification Search
CPC .. G11B 5/3912; G11B 5/1278; G11B 5/3116; G11B 5/11; G11B 5/3967; G11B 2005/3996; G11B 5/315; G11B 5/398

USPC ................................ 360/319, 322, 324–324.2
See application file for complete search history.

(56) References Cited

U.S. PATENT DOCUMENTS

| | | | |
|---|---|---|---|
| 5,828,531 A * | 10/1998 | Gill | 360/324.12 |
| 5,847,904 A * | 12/1998 | Bharthulwar | 360/322 |
| 5,986,856 A | 11/1999 | Macken et al. | |
| 6,230,389 B1 * | 5/2001 | Zhu | 29/603.1 |
| 6,999,270 B2 | 2/2006 | Watanabe et al. | |
| 7,075,761 B2 * | 7/2006 | Parker | 360/327.3 |
| 7,587,809 B2 | 9/2009 | Dimitrov et al. | |
| 7,804,668 B2 | 9/2010 | Zhou et al. | |
| 8,059,372 B2 | 11/2011 | Guo et al. | |
| 2002/0013083 A1 * | 1/2002 | Kuwayama et al. | 439/422 |
| 2004/0264064 A1 * | 12/2004 | Sakakima | 360/322 |
| 2007/0127162 A1 * | 6/2007 | Nishiyama et al. | 360/319 |
| 2007/0127163 A1 * | 6/2007 | Nishiyama et al. | 360/319 |
| 2009/0154025 A1 * | 6/2009 | Carey et al. | 360/314 |
| 2011/0181988 A1 * | 7/2011 | Garfunkel et al. | 360/319 |

* cited by examiner

*Primary Examiner* — Will J Klimowicz
(74) *Attorney, Agent, or Firm* — Hall Estill Attorneys at Law

(57) ABSTRACT

A data sensor may be configured in accordance with some embodiments to have a magnetically responsive stack that contacts at least one shield. The at least one shield may be constructed with a non-rectangular shaped electrical contact, such as a triangular and trapezoidal shape, respectively positioned on top and bottom shields on opposite sides of the magnetically responsive stack.

20 Claims, 4 Drawing Sheets

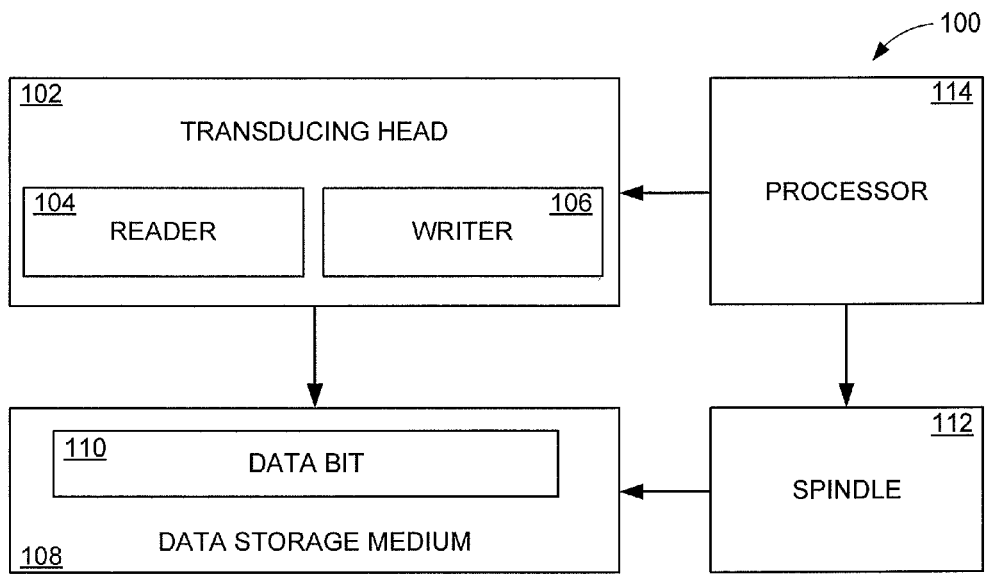
FIG. 1
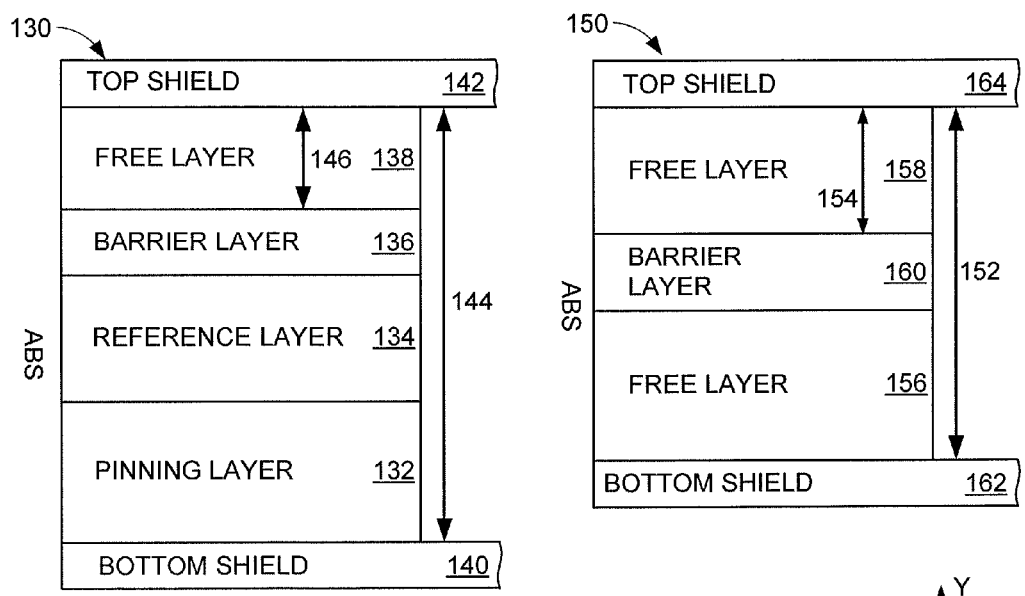

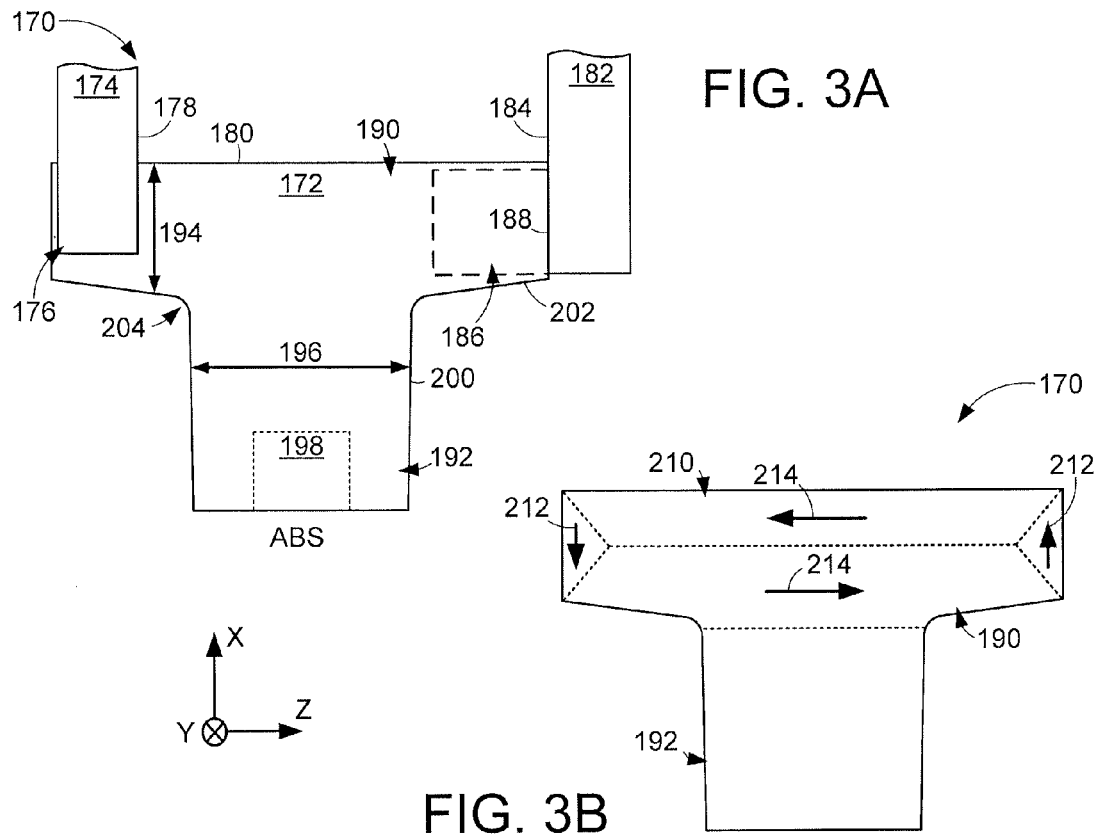
FIG. 3A
FIG. 3B
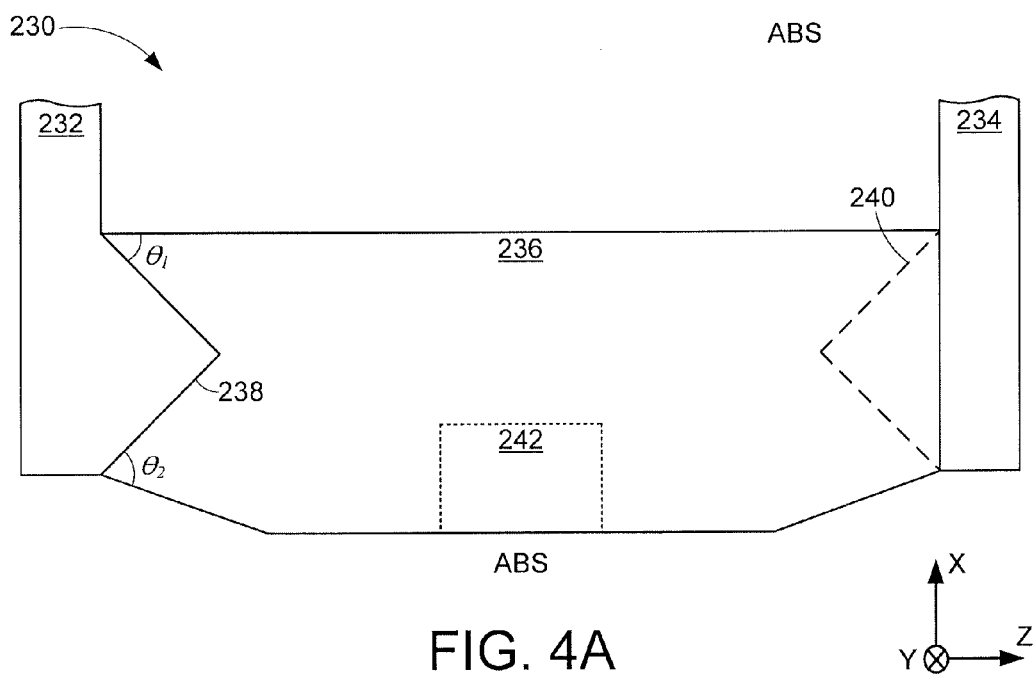
FIG. 4A

SHAPED DATA SENSOR SHIELD CONTACTS

SUMMARY

Various embodiments are generally directed to a transducing element that is capable of data sensing.

In accordance with some embodiments, data sensor may be configured to have a magnetically responsive stack that contacts at least one shield with the at least one shield having a non-rectangular shaped electrical contact.

BRIEF DESCRIPTION OF THE DRAWINGS

FIG. 1 is a block representation of an example portion of a data storage device.

FIGS. 3A and 3B respectively display top view block representations of an example data sensor constructed in accordance with various embodiments.

FIGS. 4A and 4B respectively illustrate top view block representations an example magnetic element constructed in accordance with some embodiments.

DETAILED DESCRIPTION

Figures 2A, 2B:
FIGS. 2A and 2B respectively show cross-section block representations of portions of example transducing elements each capable of being used in the data storage device of FIG. 1.

Proliferation of data storage devices in modern electronics has led to an added emphasis on data storage capacity, access speeds, and physical size. The accommodation of such emphasis through minimization of data storage components and increased data bit density on data media can heighten data storage capabilities. However, the minimization of data storage components to a nanometer scale may correspond to volatile magnetic fluctuations as magnetic domains are erratically formed and reformed in response to encountered magnetic fields. Such increased component minimization can combine with increased data bit density to accentuate erratic magnetic behavior and degrade magnetic performance of a data storage device. Hence, stabilization of reduced physical size magnetic data storage components is a continued industry goal.

Accordingly, a data sensor can be configured with a magnetically responsive stack contacting at least one shield with the at least one shield having a non-rectangular shaped electrical contact. The shaped electrical contact can establish a predetermined magnetic domain structure in the shield that stabilizes the shield, which can provide predictable magnetic sensor operation in high data bit density data storage environments. Magnetic performance of the data sensor may further be optimized as stabilized magnetic domains produce less magnetic noise that allows data signal strength and integrity to be preserved.

A diverse variety of data storage environments can utilize shaped electrical contacts and stabilized magnetic shields. A non-limiting example of such an environment is displayed by the block representation of a transducing portion 100 of an example data storage device of FIG. 1. The environment shown in FIG. 1 is constructed and operated in accordance with various embodiments to include at least a transducing head 102 that provides a data reader 104 and data writer 106 that can be positioned over a variety of locations on a magnetic storage medium 108, such as over individual stored data bits 110.

The storage medium 108 can be attached to one or more spindle motors 112 that rotate during use to produce an air bearing surface (ABS) on which the transducing head 102 flies to access predetermined portions of the medium 108. In this way, one or more local and remote processors 114 can provide controlled motion of the spindle 112 to align the reader 104 and writer 106 with selected data bits 110 and data tracks. However, the consolidation of data bits 110 to provide greater data capacity has emphasized the physical size of the transducing head 102.

As a non-limiting example of a magnetic stack that can be configured with reduced physical dimensions in a data storage device, an abutted junction magnetic stack 130 is illustrated in FIG. 2A. The magnetic stack 130 has a fixed magnetization pinning layer 132 contacting a fixed magnetization reference layer 134 opposite a non-magnetic barrier layer 136 from a magnetically free layer 138. As the free layer 138 responds to an external data bit while the reference layer 134 maintains a fixed magnetization due to the exchange coupling with the pinning layer 132, an external data bit can be read as a logic state. Through various tuned configurations, the bottom 140 and top 142 shields can be positioned on opposite sides of the magnetic stack 130 to define a shield-to-shield spacing 144.

In an effort to reduce the shield-to-shield spacing as much as possible without sacrificing data sensing between the free 138 and reference 134 layers, the free layer thickness 146 can be minimized. However, the inclusion of the reference 134 and pinning 132 layers can correspond to a smaller free layer thickness 146, increased shield-to-shield spacing 144, and reduced magnetoresistive ratio between the free 138 and reference 134 layers. In contrast, the trilayer stack 150 of FIG. 2B may be used to read data bits with a reduced shield-to-shield spacing 152 and greater free layer thickness 154 compared to the abutted junction stack 130.

Operation of the trilayer stack 150 may involve the first 156 and second 158 magnetically free layers being separated by a non-magnetic barrier layer 160 and set to default magnetizations by biasing structures (not shown) external to the trilayer stack 150. The relocation of any fixed magnetization structures from the stack 150 to elsewhere allow for the reduced physical size 152 compared to the fixed magnetization having abutted junction stack 130. However, the lack of any fixed magnetization in the trilayer stack 150 can make the biasing of free layers 156 and 158 difficult and consequently the ability to distinguish between data bits in a densely packed data medium. As such, refinement of either magnetic stack 130 and 150 has been a continued goal of the industry, particularly with providing stable magnetic sensing conditions without inducing noise or inhibiting free magnetic rotation of the free layers 138, 156 and 158 in response to external data fields.

It should be noted that the term "stack" is an unlimited term within this disclosure that can be one or more vertically and horizontally aligned layers, constructed of magnetic and non-magnetic material that are capable of magnetic reading and writing. Throughout the present application, the term "stack" will be understood to mean a component that is constructed to respond to external data bits. For example, but not in any way limiting, a magnetic stack may be a data reader that can differentiate between a plurality of data bits. Regardless of what type of magnetic stack is employed, sensing data bits corresponds with the passage of current through the constituent layers of the stack 130 and 150, parallel the ABS. Electrical connections may be made through the magnetic shields 140, 142, 162, and 164 that define the respective magnetic stack's operational extent.

FIGS. 3A and 3B respectively illustrate top views of an example magnetic sensor 170 configured to employ magnetic shield electrical current transmission that provides efficient, uniform application of electrical current through whatever type of magnetic stack that is positioned between the shields. As shown in FIG. 3A, a top shield 172 is contacted by an electrical lead 174 at a predetermined contact region 176 of the shield 172. The top electrical lead 174 has linear sidewalls 178 that enter the areal extent of the top shield 172 via a rear shield surface 180, distal the ABS. The rectangular shape and rear access of the electrical lead 174 to the top shield 172 can provide simple manufacturing and consistent surface area. However, rear lead access is not required or limited, as illustrated by the electrical lead 182 that employs a rectangular shape and right angle sidewall 184 to reach a contact region 186 of a bottom shield via access through a side shield surface 188 extending orthogonal to the ABS. Such side surface electrical lead access can increase shield stability by decreasing the physical size of the contact region 186.

In the non-limiting embodiments shown in FIGS. 3A and 3B, the top 172 and vertically aligned bottom shield each have a tuned shape characterized by a contact region 190, distal the ABS, and a lapped region 192, proximal the ABS. While the contact 190 and lapped 192 regions may be configured to have similar dimensions, constructing the contact region 190 with a predetermined length 194 along the X axis and a greater width along the Z axis than the stack region width 196 can establish prominent domains that can be used to efficiently shield and bias the magnetic stack 198.

The lapped region 192 can be defined by sidewalls 200 and 202 that extend normal to or angled with respect to the ABS and Z axis. As displayed, the sidewalls 200 and 202 are respectively angled at differing orientations and connected by a curvilinear corner 204 that is tuned to prevent the establishment of localized domains, particularly near the transition between the contact 190 and lapped 192 regions. The extended contact region width and sidewall configurations can complement each other to provide predetermined magnetic domain walls that ensure stable shield operation in view of potential shielding of large amounts of external magnetic fields and passage of large electrical currents between the electrical leads 174 and 182 through the magnetic stack 198.

FIG. 3B shows how the shaped contact 190 and lapped 192 regions of the top shield 172 can correspond to preexisting magnetic domains 210. That is, the wider contact region 190 can produce relatively small magnetizations 212 and magnetic domains that connect with relatively large magnetizations 214 and magnetic domains to form a loop that may easily be disrupted or changed by external magnetic fields. For example, the large magnetizations 214 running parallel to the ABS may inadvertently change directions and the small magnetizations 212 running perpendicular to the ABS may inadvertently disappear in the face of large external magnetic fields. With such volatility in the contact region 190, the magnetic domains in the lapped region 192 can also be unstable. Such magnetic instability is problematic for magnetic shields configured to carry data sensing current while keeping errant magnetic fields away from a magnetic stack.

Figure 4B:
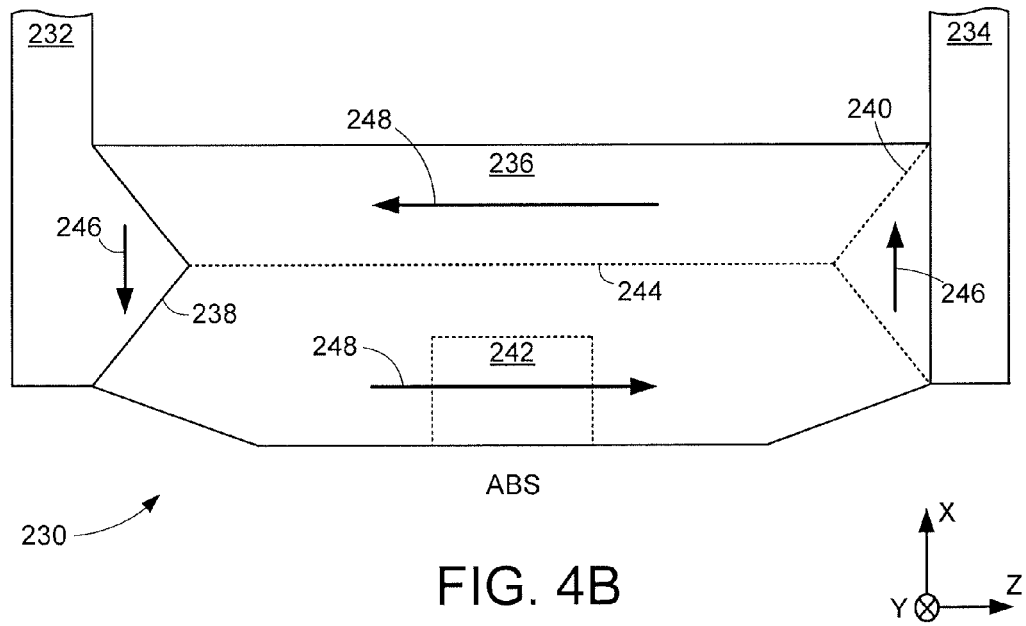

FIGS. 4A and 4B provide top view block representations of an example data transducing element 230 constructed in accordance with various embodiments to have removed the stack region of FIGS. 3A and 3B to allow a single magnetization loop to be reinforced by electrical leads 232 and 234 that respectively connect to top 236 and bottom shields via shaped electrical contacts 238 and 240 with a predetermined topography, such as a non-flat contact to shield interface. The non-rectangular shape and position of the respective electrical contacts 238 and 240 on the top 236 and bottom shields can be tuned to stabilize the magnetic domains of the shields and reduce the production of noise in the magnetic stack 242.

The establishment of stable magnetic domain walls may be finely tuned through the precise articulation of the electrical contacts 238 and 240. For example, a triangular shape may be formed, as shown, with different surface angles $\theta_1$ and $\theta_2$, such as 45° and 55° with respect to the ABS and Z axis. The orientation of the contacts 238 and 240 may also be tuned to point parallel to the ABS while extending from opposite corners of the top shield 236, which may further optimize magnetic stability and electrical operation. Such contact shape and orientation tuning can ensure magnetic domain wall establishment and preservation in predetermined locations through a wide range of magnetic field durations and amplitudes. FIG. 4B generally illustrates the top shield 236 with predetermined domain walls 244 that define magnetically stable domains and magnetizations.

With the tuned size, position, and shape of the respective top and bottom shield electrical contacts 238 and 240 to match an existing magnetic domain shape, such as the displayed triangular configuration with each contact sidewall continuously extending from opposite shield corners, the magnetic domain is reinforced and consequently the magnetization 246 is stabilized. The reinforcement of the smallest physical domain can ensure magnetizations 248 remain in the predetermined orientations to complete the magnetic loop regardless of the external magnetic field and sensing current passed through the shield 236. In some embodiments, the top shield 236 may be configured with multiple electrical contacts, such as on opposite sides of the shield along the Z axis, instead of each shield having a single contact 238 as illustrated in FIGS. 4A and 4B.

In contrast to the rectangular shaped electrical contacts generally shown in FIG. 3A that can place sensing current on opposite sides of a domain wall to distort and disorient the domain's magnetization 246, the tuned electrical contact 238 shape of FIG. 4B passes sensing current only to the predetermined magnetic domain, which strengthens the existing magnetization 246. The reinforcement of at least one magnetic domain of a shield 236 can consequently strengthen and stabilize magnetizations 248 extending parallel to the ABS by forming a loop.

Figure 5:
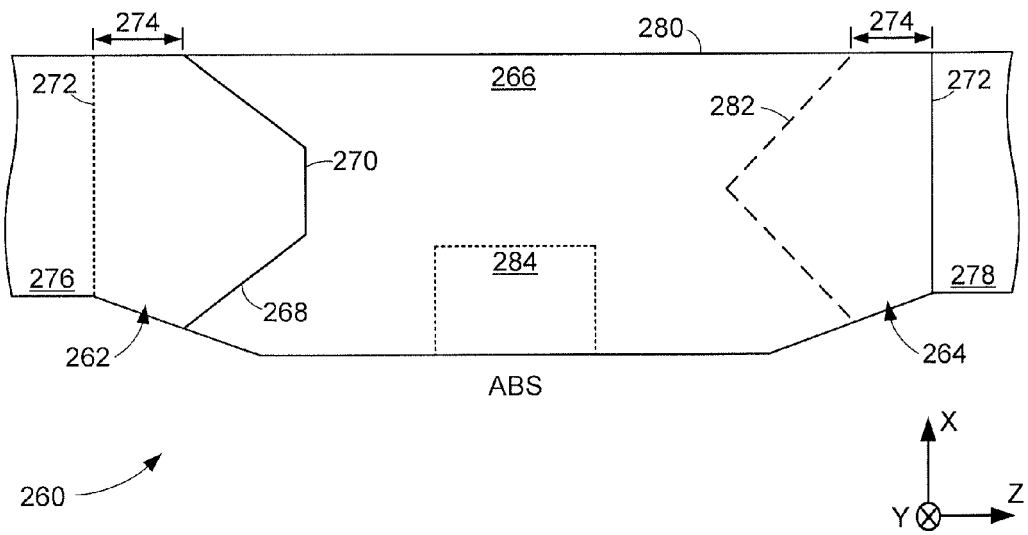
FIG. 5 is a top view block representation of an example transducing element constructed and operated in accordance with various embodiments.

FIG. 5 displays a top plan view of an example data sensing element 260 configured in accordance with some embodiments to have differently configured electrical contacts 262 and 264. With the electrical contact 262 attached to the top shield 266, a trapezoidal, non-rectangular shape is utilized with a pair of angled surfaces 268 connected by a linear surface 270 extending along the X axis, perpendicular to the ABS. The trapezoidal shape of the contact 262 can be further tuned by offsetting the angled surfaces 268 from the side surface 272 of the shield 266 by an offset distance 274.

The combination of a shaped and offset electrical contact 262 can allow the electrical leads 276 and 278 to more fully match the existing magnetic domain of the top 266 and bottom shields to provide a heightened amount of stabilization for the domain magnetizations. The electrical leads 276 and 278 may also be tuned with an exclusively side surface 272 access to each shield 266, as shown, which can prevent any shunting between the rear surface 280 of the shields and the leads 276 and 278. The tuned shape of the top shield electrical contact 262 is not exclusive or required for the bottom shield electrical contact 264. As illustrated, the bottom shield electrical contact 264 is offset from the side surface 272, but is configured with a triangular shape defined by angled surfaces 282 and without an intermediate linear connecting surface. Such differing electrical contact 262 and 264 configurations can allow the top 266 and bottom shields to have slightly different magnetic domain and magnetization profiles, such as differing domain loop strength, which may be utilized in some shield biasing schemes for providing default magnetizations in the magnetic stack 284.

Figure 6:
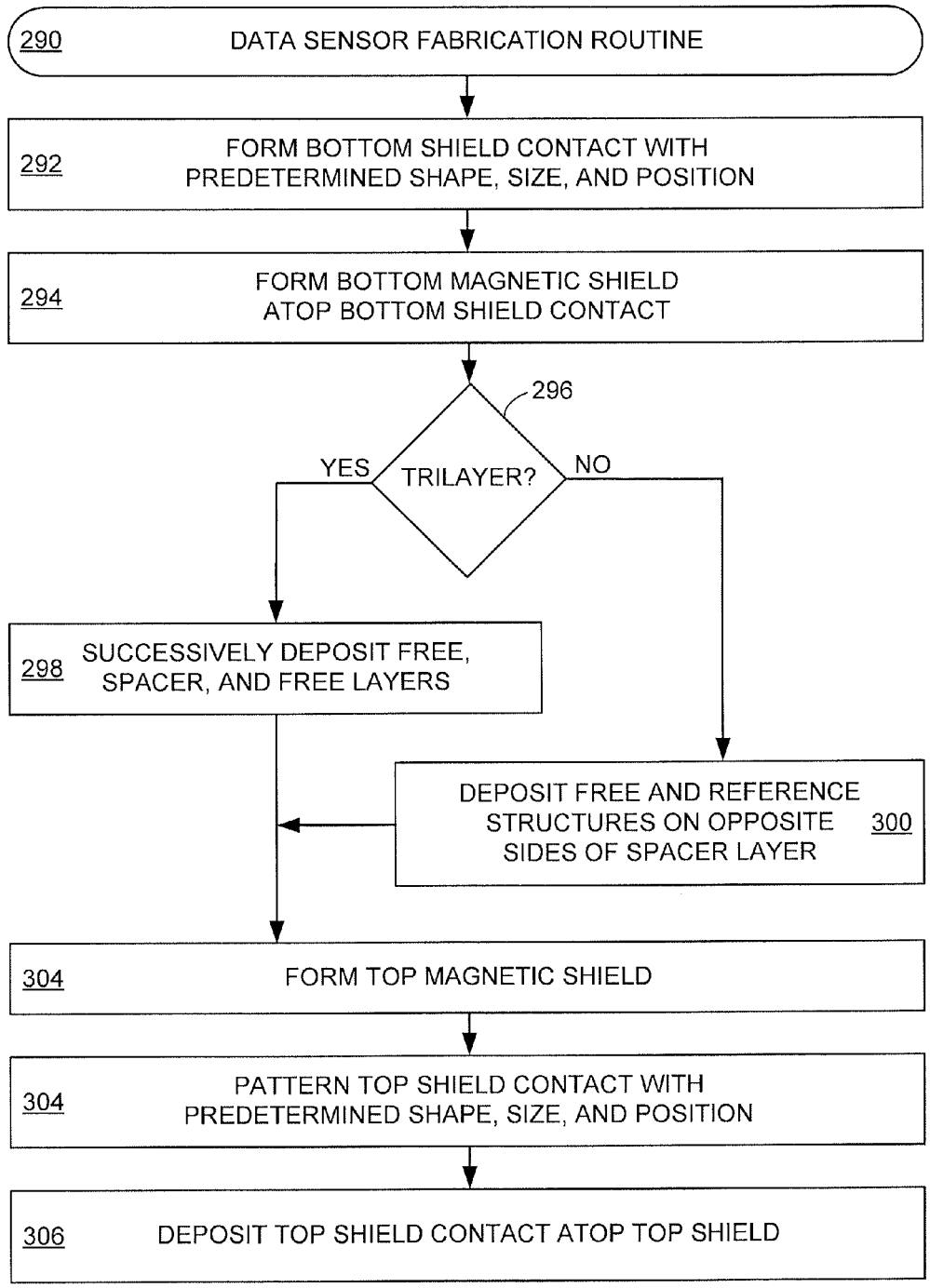
FIG. 6 provides a flowchart of a data sensor fabrication routine conducted in accordance with some embodiments.

The various electrical contact 262 and 264 configurations that utilize tuned size, position, and shape, either independently or collectively, illustrate the diversity of electrical contact construction that can be adapted to provide increased magnetic shield stability and optimized magnetic domain control. FIG. 6 generally maps an example data sensor fabrication routine 290 conducted in accordance with various embodiments. The routine 290 may begin with step 292 that forms a bottom shield electrical contact with a predetermined size, shape, and position. Non-limiting examples of possible configurations are provided by the electrical contacts 238 of FIG. 4A and 262 of FIG. 5 with differing offset distances, shapes, and surface angle orientations.

The formation of the bottom shield electrical contact is followed by step 294 where a bottom magnetic shield is formed atop the electrical contact to allow the electrical contact to conduct sensing current through the shield and control shield magnetic domain stability and orientation. With the bottom shield and electrical contact constructed, the type of data sensing magnetic stack is evaluated and determined in decision 296. A conclusion to form a trilayer magnetic stack, as illustrated by FIG. 2B, proceeds to step 298 where free layers are formed on opposite sides of a non-magnetic spacer layer.

A determination that an abutted junction magnetic stack is to be constructed from decision 296 advances routine 290 to step 300 where reference and free magnetic structures are positioned on opposite sides of a non-magnetic spacer layer. It should be noted that decision 296 may, in some embodiments, be conducted prior to the formation of the bottom shield electrical contact so the bottom shield can be configured to accommodate the magnetic stack selection, such as with biasing magnetic domains in the bottom shield.

Regardless of the type of magnetic stack chosen in decision 296 and subsequently constructed, step 302 next forms a top magnetic shield, which may or may not have a different shape and size than the bottom shield. For example, the top shield may have a differently sized stack portion and electrical lead access path than the bottom shield. The top magnetic shield is next patterned in step 304 so that a top shield electrical contact can be deposited in step 306 with a predetermined size, shape, and position. It should be noted that the formation of the electrical contacts in steps 292 and 306 are not limited to separate deposition operations as the contacts, as corresponding electrical leads, may be formed commonly to have a similar elevation between the top and bottom shields, but patterned to respectively contact the top and bottom shields independently.

Through tuned construction of electrical contacts in top and bottom shields, each shield can be stabilized as the contacts significantly match an existing magnetic domain of each shield. The ability to configure the electrical contacts for size, shape, and position can further allow for manipulation of the magnetizations corresponding to the magnetic domains of the shields. Such manipulation can allow the shields to bias an adjacent magnetic stack, form a domain loop in view of large external magnetic fields, and carry large sensing currents without altering the magnetic domain's strength and orientation. Moreover, the simpler domain configuration afforded by matching the electrical contact to the existing domain shape and position suppresses the production of magnetic noise, which in turn optimizes shielding and magnetic stack performance.

While the embodiments herein have been directed to magnetic sensing, it will be appreciated that the technology described above can readily be utilized in any number of other applications, including data writing. It is to be understood that even though numerous characteristics of various embodiments of the present disclosure have been set forth in the foregoing description, together with details of the structure and function of various embodiments, this detailed description is illustrative only, and changes may be made in detail, especially in matters of structure and arrangements of parts within the principles of the present technology to the full extent indicated by the broad general meaning of the terms in which the appended claims are expressed. For example, the particular elements may vary depending on the particular application without departing from the spirit and scope of the present disclosure.

What is claimed is:

1. An apparatus comprising a magnetically responsive stack contacting at least one shield on an air bearing surface (ABS), the at least one shield having a non-rectangular shaped electrical contact comprising first and second surfaces meeting at a point pointing along a direction parallel to the ABS, the first and second surfaces each positioned in a plane extending perpendicular to the ABS.

2. The apparatus of claim 1, wherein the magnetically responsive stack, a first shield, and a second shield each contact the ABS, the magnetically responsive stack disposed between the first and second shields.

3. The apparatus of claim 1, wherein the electrical contact is separated from and positioned distal to the ABS.

4. The apparatus of claim 3, wherein the electrical contact is positioned on a contact region of the at least one shield, the contact region having a greater width as measured parallel to the ABS than a stack region positioned on the ABS.

5. The apparatus of claim 1, wherein the electrical contact contacts and is electrically connected to an electrical lead.

6. The apparatus of claim 5, wherein the electrical lead accesses the electrical contact only from a side surface of the at least one shield.

7. The apparatus of claim 5, wherein the electrical lead is positioned external to the at least one shield and the electrical contact is positioned in direct contact with the at least one shield.

8. The apparatus of claim 1, wherein the electrical contact has a predetermined shape that substantially matches a pre-existing magnetic domain of the at least one shield.

9. The apparatus of claim 1, wherein the magnetically responsive stack comprises first and second free layers contacting opposite sides of a non-magnetic spacer and without a fixed magnetic structure.

10. The apparatus of claim 1, wherein the magnetically responsive stack comprises free and fixed magnetic structures on opposite sides of a non-magnetic spacer.

11. The apparatus of claim 1, wherein the first and second surfaces are each angled at a non-orthogonal angle to the ABS.

12. A data sensor comprising a magnetically responsive stack contacting at least one shield on an air bearing surface (ABS), the at least one shield having a triangular shaped, non-rectangular electrical contact comprising first and second surfaces meeting at a point pointing along a direction parallel to the ABS, the first and second surfaces each positioned in a plane extending perpendicular to the ABS.

13. The data sensor of claim 12, wherein the electrical contact is defined by angled contact surfaces extending from a plane offset from a side surface of the at least one shield.

14. The data sensor of claim 12, wherein the electrical contact is defined by first and second angled contact surfaces, the contact surfaces having different angles with respect to the ABS.

15. The data sensor of claim 12, wherein the first and second surfaces extend from respective corners of a contact region of the at least one shield.

16. The data sensor of claim 12, wherein electrical contact establishes a magnetic domain magnetization oriented orthogonal to the ABS.

17. A transducing element comprising a magnetically responsive stack disposed between and contacting top and bottom shields on an air bearing surface (ABS), the top and bottom shields each having a triangular, non-rectangular shaped electrical contact separated from the ABS and comprising first and second surfaces meeting at a point pointing along a direction parallel to the ABS, the first and second surfaces each positioned in a plane extending perpendicular to the ABS.

18. The transducing element of claim 17, wherein each shield comprises a single electrical contact.

19. The transducing element of claim 18, wherein the single electrical contact of the top shield is positioned on an opposite lateral side than the single electrical contact of the bottom shield.

20. The transducing element of claim 17, wherein the top shield comprises a first electrical contact having a first non-rectangular shape and the second bottom shield comprises a second electrical contact having a second non-rectangular shape, different than the first non-rectangular shape.

* * * * *